United States Patent
Knecht et al.

(10) Patent No.: US 7,466,210 B2
(45) Date of Patent: Dec. 16, 2008

(54) VOLTAGE CONTROLLED SURFACE ACOUSTIC WAVE OSCILLATOR MODULE

(75) Inventors: Thomas A. Knecht, Dundee, IL (US); Robert A. Jacobson, Orland Park, IL (US)

(73) Assignee: CTS Corporation, Elkhart, IN (US)

( * ) Notice: Subject to any disclaimer, the term of this patent is extended or adjusted under 35 U.S.C. 154(b) by 131 days.

(21) Appl. No.: 11/436,816

(22) Filed: May 18, 2006

(65) Prior Publication Data
US 2006/0279367 A1  Dec. 14, 2006

(51) Int. Cl.
*H03B 5/36* (2006.01)
(52) U.S. Cl. .......................... 331/68; 331/158
(58) Field of Classification Search .................. 331/68, 331/158
See application file for complete search history.

(56) References Cited

U.S. PATENT DOCUMENTS

| | | | |
|---|---|---|---|
| 6,118,347 A | 9/2000 | Ohira | |
| 6,700,448 B1 * | 3/2004 | Knecht | 331/68 |
| 2005/0088251 A1 * | 4/2005 | Matsumoto | 331/158 |

FOREIGN PATENT DOCUMENTS

EP  1 111 769  6/2001

OTHER PUBLICATIONS

TXC Corporation, 7×5mm SMD Seam Sealed VCSO / 8P Series, Dec. 1, 2006, p. 35, TXC Corporation, Japan.
TXC Corporation, TXC 622 MHz 7×5mm VCSO with Ceramic Carrier, Jul. 9, 2006, TXC Corporation, Japan.
Vectron International, VS-700 Voltage Controlled SAW Oscillator, Jun. 28, 2006, pp. 1-7, Vectron International, New Hampshire, U.S.A.
Tom Knecht, 7×5mm VCSO with Ceramic Carrier, Apr. 19, 2004, CTS Corporation, Bloomingdale, Illinois, U.S.A.
Beasley-Suffolk, D., PCT International Search Report mailed Jan. 29, 2007, re: International Application No. PCT/US2006/019616 filed May 18, 2006.
Beasley-Suffolk, D., PCT Written Opinion of the International Searching Authority mailed Jan. 29, 2007 re: International Application No. PCT/US2006/019616 filed May 18, 2006.

* cited by examiner

*Primary Examiner*—Joseph Chang
(74) *Attorney, Agent, or Firm*—Mark P. Bourgeois; Daniel J. Deneufbourg

(57) ABSTRACT

A module for a surface acoustic wave oscillator includes a substrate having a top surface, a bottom surface and peripheral side faces. Several castellations are located about the outer peripheral side faces thereof. The castellations form an electrical connection between the top and bottom surfaces of the substrate. Connection pads are mounted on the top surface and are adapted for connection to the castellations. An oscillator circuit and a surface acoustic wave device are mounted on the top surface and connected to the connection pads. A cover is mounted over the substrate and has at least one tab adapted to be fitted within a respective one of the castellations. The overall module with the cover has a dimension of approximately 5 mm in width, 7 mm in length, and 2.7 mm in height.

15 Claims, 8 Drawing Sheets

US 7,466,210 B2

VOLTAGE CONTROLLED SURFACE ACOUSTIC WAVE OSCILLATOR MODULE

FIELD OF THE INVENTION

This invention relates to oscillators and, in particular, to a voltage controlled surface acoustic wave oscillator (VCSO).

DESCRIPTION OF THE RELATED ART

High capacity data networks rely on signal repeaters and sensitive receivers for low-error data transmission. To decode and/or cleanly retransmit a serial data signal, such networks include components which create a data timing signal having the same phase and frequency as the data signal. This step of creating a timing signal has been labeled "clock recovery."

Data clock recovery requires a relatively high purity reference signal to serve as a starting point for matching the serial data signal clock rate and also requires circuitry for frequency adjustment. The type, cost and quality of the technology employed to generate the high purity reference signal vary according to the class of data network application. For fixed large-scale installations, an "atomic" clock may serve as the ultimate source of the reference signal. For remote or movable systems, components including specially configured quartz resonators have been used. As communication network technology progresses towards providing higher bandwidth interconnections to local area networks and computer workstations, the need has grown for smaller and less-expensive clock recovery technology solutions.

For higher frequency applications now in demand, e.g., above 300 MHz, more conventional resonator technologies such as standard AT-cut quartz crystals have not been fully successful. The recognized upper limit for fundamental-mode, straight blank AT-cut crystals is about 70 MHz. Above 300 MHz, a surface acoustic wave (SAW) oscillator can be used.

In wireless base station applications, a VCSO can be used as a frequency source for a digital to analog converter (DAC).

The packaging of SAW oscillator components is critical to the performance of the oscillator. There remains a need for lower cost SAW oscillators. The associated market favors smaller designs and consumer-level pricing. Towards these objectives rigorous attention is applied to electronic component costs and sizes. Cost and size constraints are important factors in crystal oscillator design.

Because even dust-size contamination of SAW resonators affects center frequencies, packaging and handling for SAW oscillator components is critical. Currently, most SAW based ceramic oscillator modules are assembled in clean room environments, using the following steps: Initially, a multilayer cofired ceramic module defining an interior chamber or cavity is provided. Silver epoxy is then applied in the cavity followed by the placement in such cavity of an IC and related chip components. The silver epoxy is then allowed to cure and the IC is wire bonded. Additional silver epoxy is dispensed on edges defined in the chamber, and a SAW crystal is then placed inside the chamber over the ledge. The epoxy is cured and then the crystal may optionally be actively tuned. An inert, dust-free atmosphere is then created in the chamber and a metal lid is seam welded over the chamber opening to hermetically seal the SAW crystal and other components therein.

These special packaging and handling requirements not only contribute to the cost of manufacturing oscillator components but also limit efforts at reducing the overall module size.

There is a current ongoing need for an improved SAW oscillator module that can be mass-produced at a lower cost.

SUMMARY OF THE INVENTION

It is a feature of the invention to provide a module for a surface acoustic wave oscillator which measures approximately 5 mm in width, 7 mm in length, and 2.7 mm in height.

The oscillator module includes a substrate having a top surface, a bottom surface and outer peripheral edge faces. Several castellations are defined in the outer peripheral edge faces. Selected ones of the castellations form an electrical connection between the top surface and the bottom surface. Several conductive pads are mounted on the top surface. A portion of the conductive pads can be connected to a portion of the castellations. An oscillator circuit is mounted on the top surface and is connected to the conductive pads. A surface acoustic wave device is mounted to the top surface and is connected to a portion of the conductive pads and is coupled to the oscillator circuit. A cover has at least one tab. The cover is mounted over the top surface of the substrate. The tab is adapted to be fitted within a selected one of the castellations to form an electrical connection between the cover and the substrate.

BRIEF DESCRIPTION OF THE DRAWINGS

These and other features of the invention can best be understood by the following description of the accompanying drawings as follows.

Figure 1:
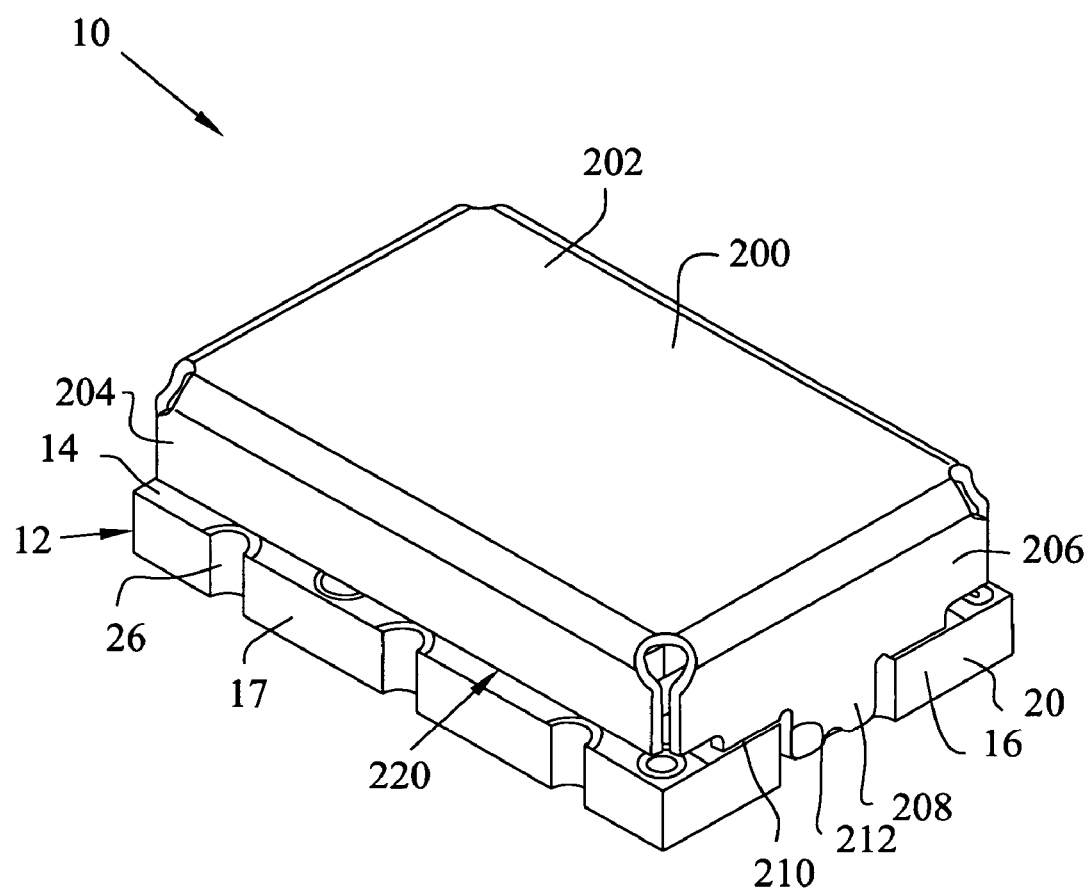
FIG. 1 is an overall perspective view of a surface acoustic wave oscillator module in accordance with the present invention.

It is noted that the drawings of the invention are not to scale. The drawings are intended to depict only typical embodiments of the invention, and therefore should not be considered as limiting the scope of the invention. The invention will be described with additional specificity and detail through the accompanying specification and claims.

DETAILED DESCRIPTION OF THE EMBODIMENTS

Oscillator Module

Referring to FIGS. 1-5, a surface acoustic wave oscillator module 10 is shown. Oscillator module 10 includes a substrate 12, a cover 200, an oscillator circuit 100 and a surface acoustic wave resonator (SAW) 150 which is mounted over the top surface 14 of substrate 12 together with other selected chip components as described in more detail below.

Figure 2:
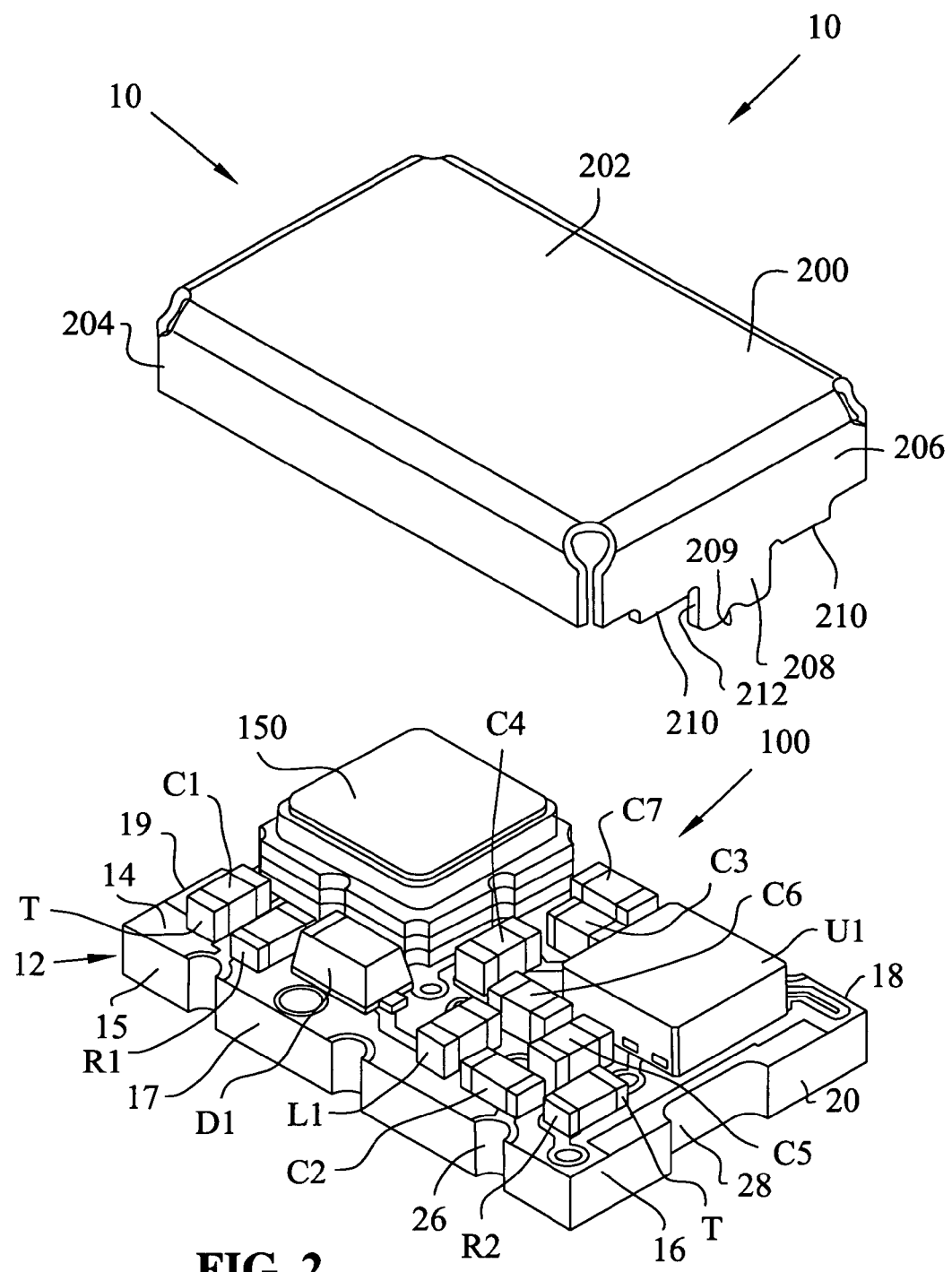
FIG. 2 is a perspective view of the module of FIG. 1 with the cover removed.

Generally rectangularly-shaped substrate 12 has a top surface 14, a bottom surface 15 (FIGS. 4 and 5) and an outer peripheral circumferential edge 16 defining side faces or edges 17, 18, 19 and 20 (FIG. 2). Substrate 12, is preferably a conventional printed circuit board (PCB). In one embodiment, substrate 12 is comprised of three stacked dielectric layers 22a, 22b and 22c and plated through-holes 24 (FIG. 5) extending generally perpendicularly through the dielectric layers and between the top and bottom surfaces 14 and 15 respectively. Substrate 12 can also have four copper or metal layers 25a, 25b, 25c and 25d. The layer 25b is sandwiched between dielectric layers 22a and 22b, the layer 25c is sandwiched between dielectric layers 22b and 22c, the layer 25a covers the outer surface of dielectric layer 22a and the layer 25d covers the outer surface of dielectric layer 22c.

Metal layer 25a can be patterned to make various electrical connections. Metal layer 25b can be a ground plane that can be connected to ground and provide shielding from electromagnetic interference. Metal layer 25c can be patterned to make various electrical connections. Metal layer 25d can be patterned with a ground plane.

Substrate 12 can have dimensions that are less than approximately 5 mm in width and 7 mm in length.

Substrate 12 has SAW connection pads 34, integrated circuit connection pads 36 and other connection pads 38 mounted on top surface 14. Connection pads 34, 36 and 38 are used to solder attach the terminals of electronic components directly to the top surface 14 of substrate 12 as described in more detail below. Several circuit lines 40 are mounted on top surface 14. The connection pads and circuit lines can be formed by, for example, the subtractive etching of copper layer 25a.

Plated through-holes 24 extend between top surface 14 and bottom surface 15 and thus the various metal and dielectric layers defining the same. The plated through-holes 24 are used to make an electrical connection between the top and bottom surfaces (i.e., layers 25a and 25d) and the intermediate inner metallized layers 25b and 25c. Plated through-holes 24 may be formed by electroplating or the like process used to deposit a layer of copper material onto the interior surface of through-holes 24.

Castellations 26 and 28 are located about the outer peripheral edge 16. Castellations 26 are defined in the side faces 17 and 18 of substrate 12, while castellations 28 are defined in side faces 19 and 20 of substrate 12. Castellations 26 are defined by metallized semicircular grooves which have been carved out of the respective side faces 17 and 18 and extend between the respective top and bottom surfaces 14 and 15 of the substrate 12. In the embodiment shown, the castellations 26 are defined by plated through-holes similar to through-holes 24 which have been cut in half during manufacturing. Castellations 26 extend along the length of respective side faces 17 and 18 in spaced-apart and parallel relationship. In the embodiment shown, each of the side faces 17 and 18 has three castellations 26 defined therein.

Metallized castellations 28 are defined by extended or elongated grooves which have been carved out of the respective substrate side faces 19 and 20. In the particular embodiment, castellations 28 are formed from plated through slots that have been cut in half during manufacturing.

The outer surface of respective castellations 26 and 28 are coated as by electroplating or the like, with a layer of copper and are electrically conductive. Castellations 26 and 28 and, more specifically, the copper thereon creates an electrical path between top surface 14 and bottom surface 15 of substrate 12. Castellations 28 can be connected to ground. The copper extends around both the top and bottom edges of each of the castellations 26 so as to define a generally arcuate strip or pad of copper or the like conductive material 26a on the top surface 14 of substrate 12 and surrounding the top edge of each of the respective castellations 26. A similar arcuate strip or pad 26b is formed on the bottom surface 15 and surrounds the lower edge of each of the respective castellations 26.

Each of the castellations 28 additionally defines a strip or pad 28a of copper or the like conductive material that is formed on the top surface 14 of substrate 12 and surrounds the top peripheral edge of each of the respective castellations 28. Each of the castellations 28 additionally defines a pad or strip 28b of copper or the like conductive material which is formed on the bottom surface 15 of substrate 12 and surrounds the lower peripheral edge of each of the respective castellations 28.

Circuit lines 40 are used make various electrical connections between the connection pads 34, 36, 38, the castellations 26 and the plated through-holes 24. A portion of the circuit lines and conductive pads can be connected to a portion of the castellations 26 in order to make electrical connections as dictated by the circuit design. Referring to FIG. 2, several electronic pre-packaged components that form an oscillator circuit 100 are mounted on the top surface 14 of substrate 12 using traditional solder SMT assembly procedures. The electronic components have terminals T. The electronic components are mounted directly to the top surface of substrate 12 by soldering their respective terminals T to connection pads 34, 36 and 38 on top surface 14. Capacitors C1, C2, C3, C4, C5, C6, C7 and C8, resistors R1, R2, R3 and R4, inductor L1, diode D1 and SAW resonator 150 are all mounted to top surface 14 as shown in FIG. 2. An integrated circuit U1 is also mounted on surface 14. The height of SAW resonator 150 dictates the maximum height of the entire module 10 which, in this embodiment, is a maximum of 2.7 mm.

Cover 200 has a top surface 202 and side surfaces or walls 204 and 206. A tab 208 extends downwardly from the lower peripheral edge of the walls 204 and 206 respectively. A flat shoulder portion 210 extends downwardly from the lower edge of each of the walls 204 and 206 on each side of the respective tabs 208. Shoulders 210 are shorter than the tabs 208 and are adapted to rest over the respective castellation pads 28a on the top surface 14 of substrate 12 when the cover 200 is seated over the substrate 12. Flat portions 210 support cover 200 over substrate 12.

Each of the tabs 208 has a side edge 212. Tabs 208 are adapted to be fitted into a relationship wherein the inner surface of each of the respective tabs 208 is in frictional engagement with the outer surface of respective castellations 28 when the cover 200 is seated and mounted over the top of the substrate 12 so as to create an electrical connection between cover 200 and substrate 12. In this manner, cover 200 can be grounded. The presence of shoulders 210 on the lower peripheral edge of each of the side walls 204 and 206 of cover 200 creates a gap 220 between the cover 200 and substrate 12 when the cover 200 is seated over the substrate 12. Each of the tabs 208 additionally defines a groove 209 defined in the distal peripheral edge thereof. The width of tabs 208 is less than the width of castellations 28 so as to define a gap between the edges of castellations 28 and the tabs 208 when the cover 200 is seated over the substrate 12.

Figure 3:
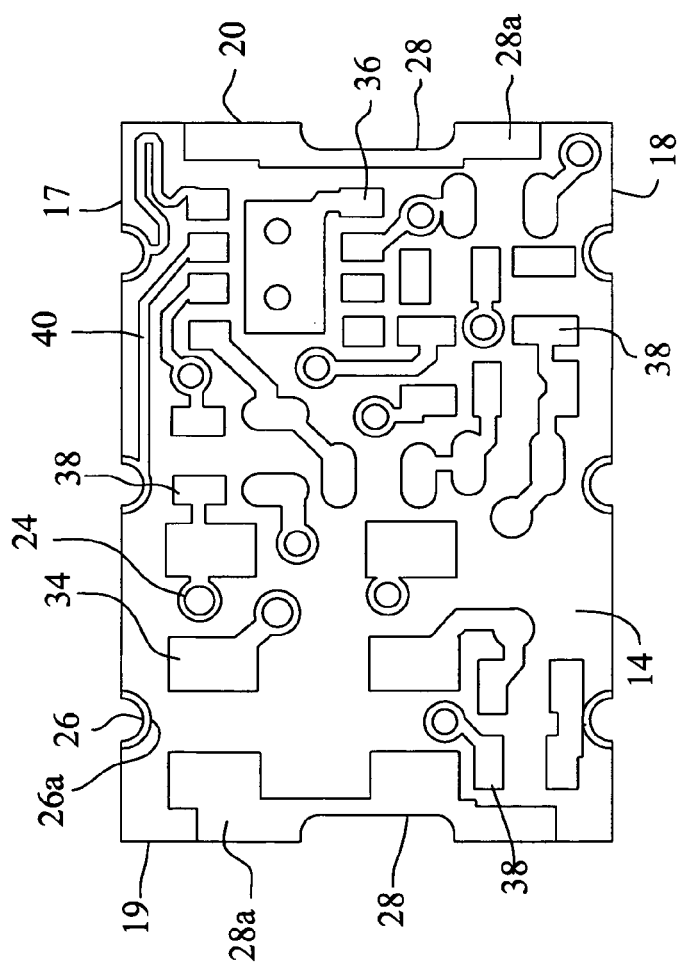
FIG. 3 is a top plan view of an embodiment of a printed circuit board for the module of FIG. 1.
Figure 5:
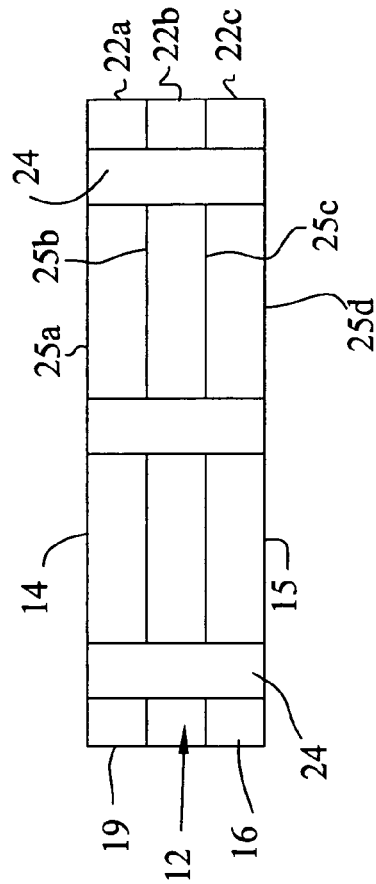
FIG. 5 is an enlarged side elevational view of the layers of the printed circuit board of FIGS. 3 and 4.
Figure 4:
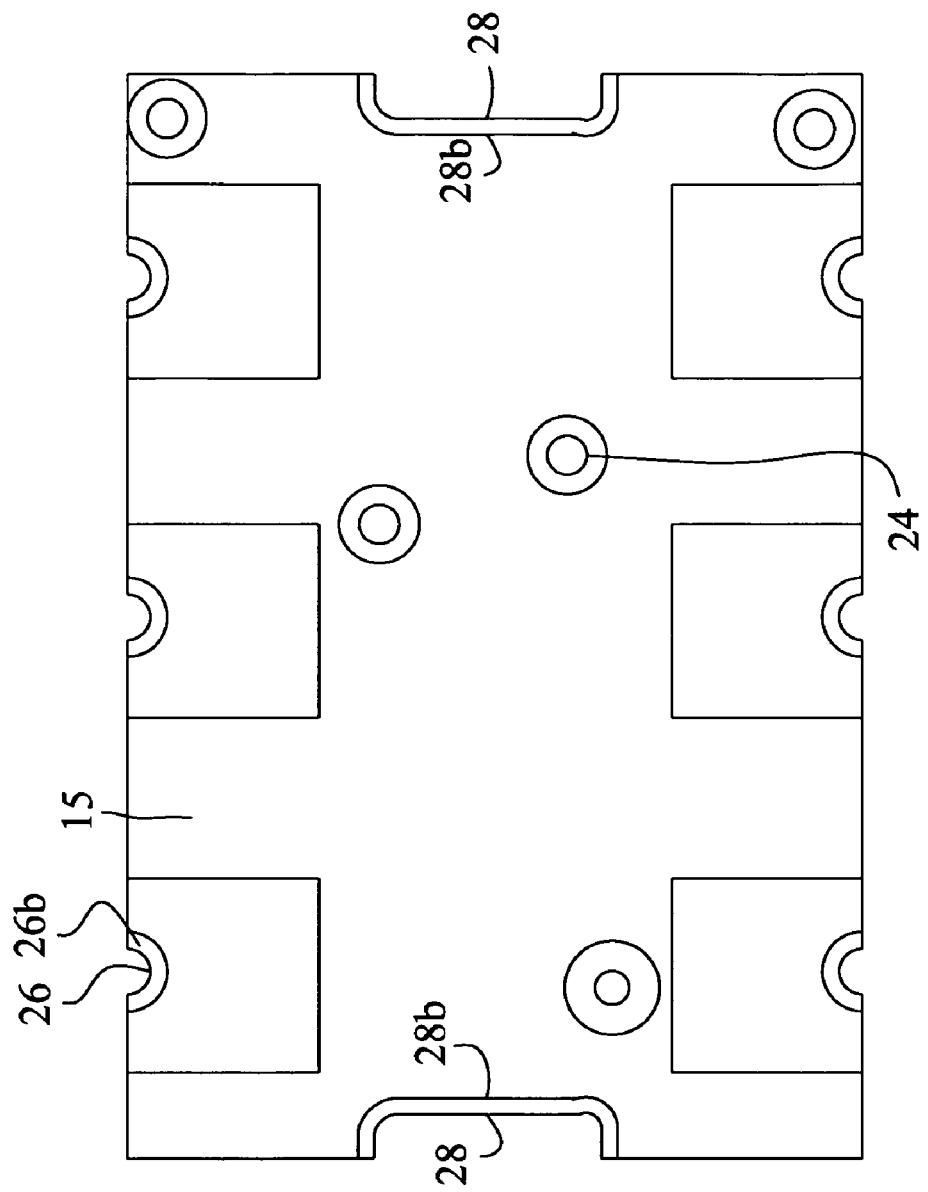
FIG. 4 is a bottom plan view of the printed circuit board of FIG. 3.

An oscillator module 10 according to the present invention may be fabricated using the following process steps: Initially, a substrate 12 is provided upon which the circuit patterns shown in FIGS. 3 and 4 are formed as by etching or the like. Solder is then screened onto the selected portions of the top surface 14 of substrate 12. All of the components, including the SAW resonator 150, are then placed over the top surface 14 of substrate 12 followed by the placement of the cover 200 over all of the components and the substrate 12 so as to form the module of FIG. 1. The module can then be reflow soldered and optionally passively laser trimmed. Finally, the module may be tested. The overall resulting module 10 has overall dimensions of approximately 5 mm in width, 7 mm in length and 2.7 mm in height.

This invention thus addresses the complex processing challenges presented by current ceramic based VCSO modules by allowing the placement of pre-packaged components on a PCB substrate using traditional solder SMT assembly steps. Specifically, the PCB substrate based VCSO module of the present invention eliminates the need for bare die, epoxy dispensing, exposed crystal processing in a clean room environment, and seam welding. The module of the present invention also lends itself to "multiple up" processing without the need for sophisticated tooling, i.e., a major advantage of PCB versus ceramic assembly.

Oscillator Circuit

Figure 6:
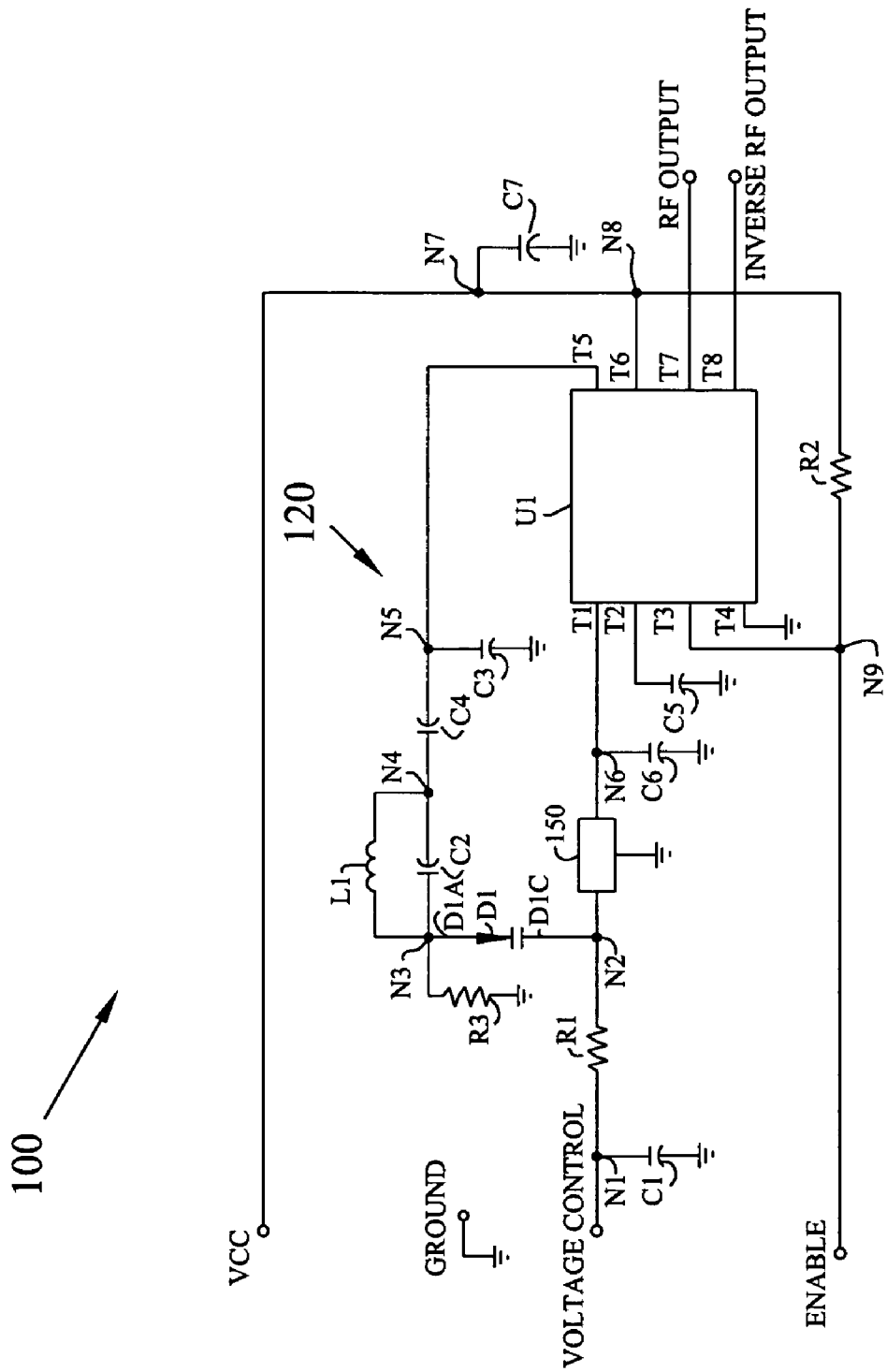
FIG. 6 is a schematic diagram of an oscillator circuit in accordance with the present invention.

Referring to FIG. 6, a schematic diagram of a voltage controlled surface acoustic wave oscillator (VCSO) circuit 100 is shown. VCSO circuit 100 includes a voltage controlled oscillator circuit 120 and a surface acoustic wave resonator device (SAW) 150.

Voltage controlled oscillator circuit 120 can comprise an integrated circuit U1. Integrated circuit U1 includes an oscillator transistor, an amplifier, a signal conditioner and a LVPECL driver. Integrated circuit U1 can be a Texas Instruments part number SN65LVP16DRFR. Integrated circuit U1 is a surface mount component that has eight terminals or pads. Integrated circuit U1 has terminals T1, T2, T3, T4, T5, T6, T7 and T8.

Terminal T1 is connected to node N6. Terminal T2 is connected to capacitor C5. Terminal T3 is connected to node N9. Terminal T4 is connected to ground. Terminal T5 is connected to node N5. Terminal T6 is connected to node N8 or power supply terminal Vcc. Terminal T7 is connected to output terminal RF output. Terminal T8 is connected to the inverse RF output terminal.

Resistor R2 is connected between node N7 and node N9. Capacitor C7 is connected between node N7 and ground. Capacitor C5 is connected to ground. Capacitor C3 is connected between node N5 and ground. Capacitor C4 is connected between nodes N4 and N5. A parallel combination of an inductor L1 and capacitor C2 is connected between node N3 and node N4. Power source Vcc is preferably set at 3.3 volts. Capacitor C6 is connected between node N6 and ground. A SAW resonator 150 can be connected between node N2 and node N6. SAW resonator 150 can be a hermetically sealed surface wave acoustic resonator that is commercially available from TAI-SAW Corporation of Taiwan. SAW resonator 150 can resonate at a nominal frequency of 622.08 MHz or above. SAW resonator 150 is also connected to ground. In some embodiments, SAW resonator 150 can optionally be connected to a variable or trimmable inductor (not shown). The inductance of the trimmable inductor can be varied in order to more precisely tune the operating frequency of the oscillator.

Varactor diode D1 has an anode D1A and a cathode D1C. Cathode D1C is connected to node N2. Anode D2A is connected to node N3. Resistor R3 is connected between node N3 and ground.

Resistor R1 is connected between node N1 and node N2. Capacitor C1 is connected between node N1 and ground. Node N1 is connected to a voltage control terminal. Node N9 is connected to an enable terminal.

Varactor diode D1 changes capacitance in proportion to the voltage applied at the voltage control terminal. In this manner, changing the voltage at the voltage control terminal can control the operating frequency of the oscillator.

Oscillator circuit 100 is arranged in a Colpitts configuration. However, this is not a requirement of the invention, and the oscillator may be of other oscillator configurations including, but not limited to Clapp, Driscoll, Butler, Pierce, and Hartley oscillator configurations.

The oscillator shown in the present specification utilizes a SAW resonator. However, it is contemplated that any other type of resonator could be used including, but not limited to, quartz crystals, FBAR, lithium niobate, and other piezoelectric materials.

First Alternate Embodiment

Figure 7:
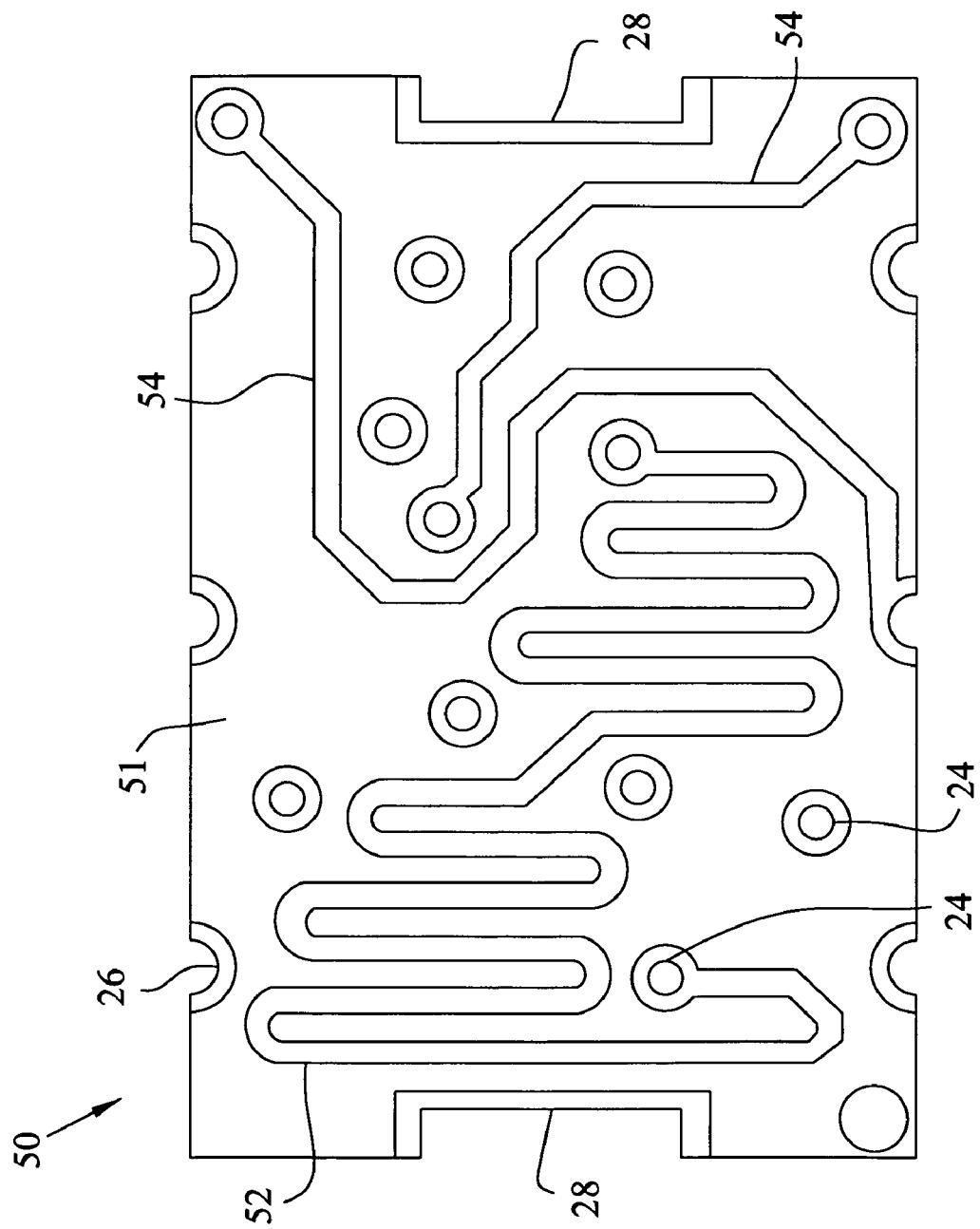
FIG. 7 is a top plan view of an alternative embodiment of an inner layer of the printed circuit board of FIGS. 3 and 4.

Referring to FIG. 7, a drawing of an alternative metal layer 50 for the substrate 12 is shown. Layer 50 can replace layer 25c shown in FIG. 5. Inner layer 50 has a top surface 51. A winding, serpentine-shaped circuit line 52 is mounted on surface 51. Other circuit lines 54 can also be mounted on surface 51. Circuit lines 54 can be connected with plated through-holes 24 in an appropriate configuration in order to connect oscillator 100.

Circuit line 52 has a serpentine or looped shape and is designed to have sufficient distributed self-inductance to replace inductor L1 shown in FIG. 2 and mounted on top surface 15. Circuit line 52 can also be connected with plated through-holes 24 in an appropriate configuration in order to replace discrete inductor L1. The use of an interior circuit line 52 results in a more compact module and eliminates the cost of purchasing and mounting an exterior inductor L1 to the top surface 14 of substrate 12.

Second Alternate Embodiment

Figure 8:
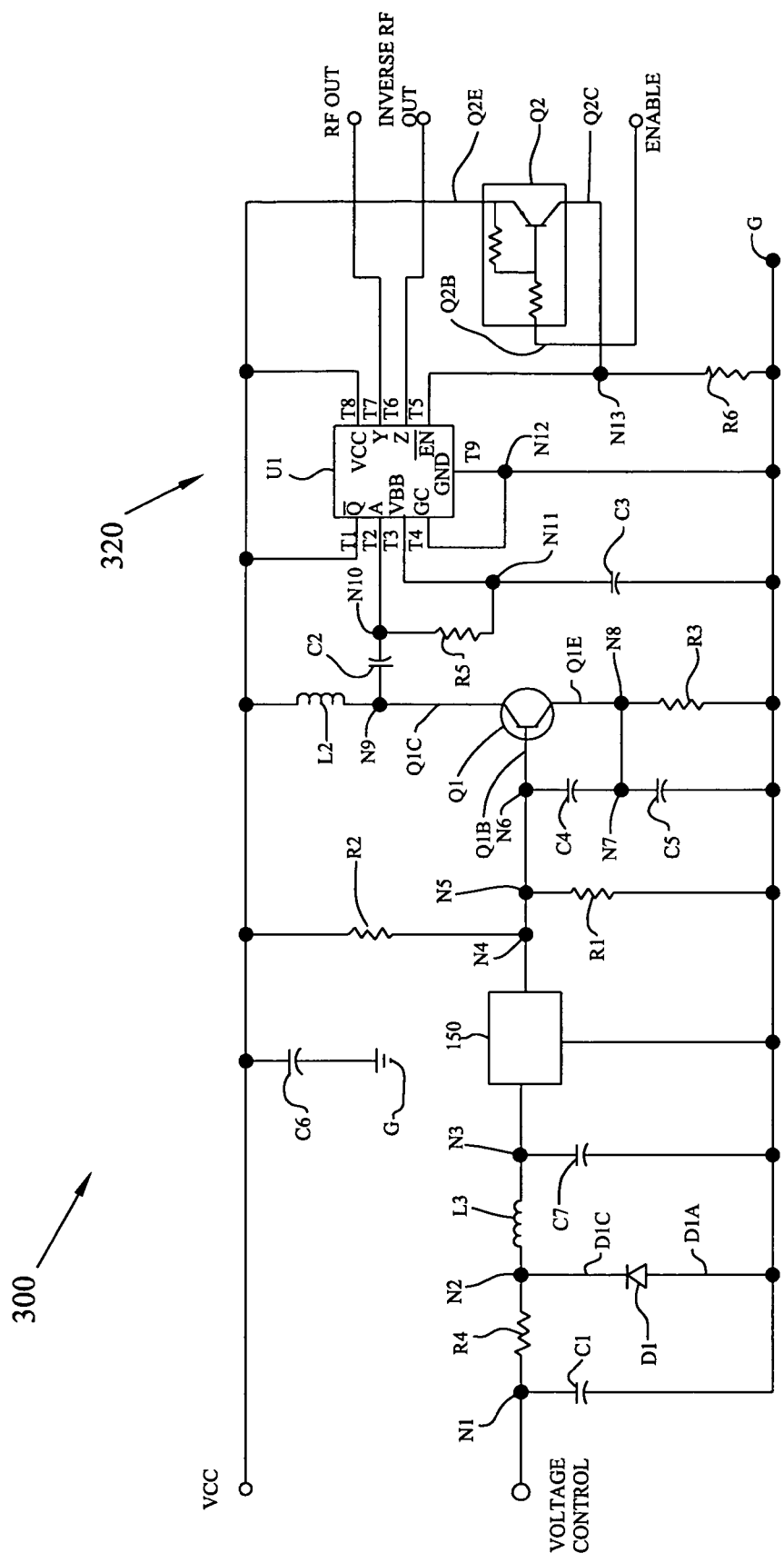
FIG. 8 is a schematic diagram of an alternative embodiment of an oscillator circuit.

Referring to FIG. 8, an alternative embodiment of a voltage controlled surface acoustic wave oscillator (VCSO) circuit 300 is shown. VCSO circuit 300 includes a voltage controlled oscillator circuit 320 and a surface acoustic wave resonator device (SAW) 150.

Voltage controlled oscillator circuit 120 can comprise an integrated circuit U1. Integrated circuit U1 includes an amplifier, a signal conditioner and a LVPECL driver. Integrated circuit U1 can be a Texas Instruments part number SN65LVDS16 that is commercially available from Texas Instruments Corporation of Dallas, Tex. Integrated circuit U1 is a surface mount component that has nine (9) terminals or pads. Integrated circuit U1 has terminals T1, T2, T3, T4, T5, T6, T7, T8 and T9.

Terminal T1 is connected to power supply terminal Vcc. Power supply terminal Vcc can be set at 3.3 volts. Terminal T2 is connected to node N10. Terminal T3 is connected to node N11. Terminal T4 is connected to node N12 or ground. Terminal T5 is connected to node N13. Terminal T6 is connected to the inverse RF output terminal. Terminal T7 is connected to the RF output terminal. Terminal T8 is connected to power supply terminal Vcc. Terminal T9 is connected to node N12 or ground.

Resistor R6 is connected between node N13 and ground. Capacitor C3 is connected between node N11 and ground. Resistor R5 is connected between node 11 and node 10. Capacitor C2 is connected between node 9 and node 10. Inductor L2 is connected between node N9 and power supply terminal Vcc.

Transistor Q2 has a base Q2B, a collector Q2C and an emitter Q2E. Emitter Q2E is connected to power supply terminal Vcc. Collector Q2C is connected to node N13. Base Q2B is connected to an enable terminal.

Oscillator transistor Q1 has a base Q1B, a collector Q1C and an emitter Q1E. Emitter Q1E is connected to node N8. Collector Q1C is connected to node N9. Base Q1B is connected to node N6.

Capacitor C4 is connected between node N6 and node N7. Capacitor C5 is connected between node N7 and ground. Resistor R3 is connected between node N8 and ground. Resistor R1 is connected between node N5 and ground. Resistor R2 is connected between node N4 and power supply terminal Vcc. Capacitor C6 is connected between power supply terminal Vcc and ground.

A SAW resonator 150 can be connected between node N3, node N4 and ground. SAW resonator 150 can be a hermetically sealed surface wave acoustic resonator that is commercially available from TAI-SAW Corporation of Taiwan. SAW resonator 150 can resonate at a nominal frequency of 622.08 MHz or above. SAW resonator 150 is also connected to ground.

Varactor diode D1 has an anode D1A and a cathode D1C. Cathode D1C is connected to node N2. Anode D1A is connected to ground. Capacitor C7 is connected between node N3 and ground. Inductor L3 is connected between node N2 and node N3. Resistor R4 is connected between node N2 and node N1. Capacitor C1 is connected between node N1 and ground. Node N1 is connected to a voltage control terminal.

Varactor diode D1 changes capacitance in proportion to the voltage applied at the voltage control terminal. In this manner, changing the voltage at the voltage control terminal can control the operating frequency of the oscillator.

Oscillator circuit 300 is arranged in a Colpitts configuration. However, this is not a requirement of the invention, and the oscillator may be of other oscillator configurations including, but not limited to Clapp, Driscoll, Butler, Pierce, and Hartley oscillator configurations.

The oscillator shown in circuit 300 utilizes a SAW resonator. However, it is contemplated that any other type of resonator could be used including, but not limited to, quartz crystals, FBAR, lithium niobate, and other piezoelectric materials.

Turning now to FIG. 8, a substrate or printed circuit board 12 containing the physical components of oscillator 300 is shown. Printed circuit board 12 has a top surface 14, an outer peripheral circumferential edge 16, and plated through-holes 24.

Castellations 26 and 28 are located about the outer peripheral edge 16. Castellations 26 and 28 are defined in the outer edge 16 of substrate 12. The castellations were previously described for FIGS. 1-5. Castellations 26 have a conductive strip 26a.

Substrate 12 has SAW connection pads 34, integrated circuit connection pads 36 and other connection pads 38 mounted on top surface 14. Connection pads 34, 36 and 38 are used to solder attach the terminals of the electronic components of circuit 300 directly to the top surface 14 of substrate 12. Several circuit lines 40 are mounted on top surface 14 and are used to make electrical connections between the electronic components, the plated through-holes and the castellations.

Figure 9:
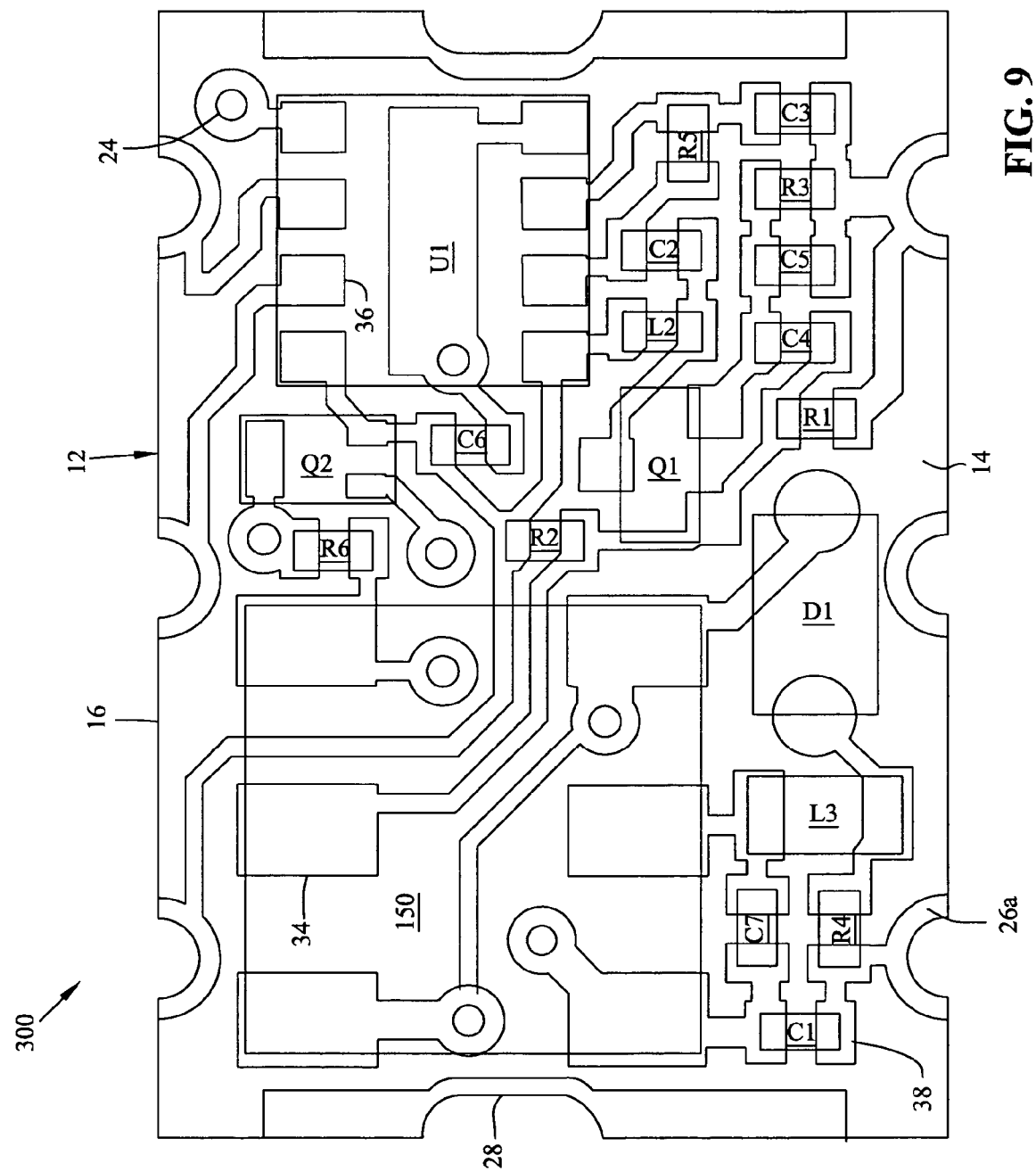
FIG. 9 is a top plan view of the printed circuit board used with the circuit of FIG. 8.

Substrate 12 of FIG. 9 can be assembled with cover 200 of FIG. 1 as previously described. Cover tabs 208 are press fit into castellations 28 in order to enclose oscillator 300 and provide an electrical connection between the cover and the substrate. The electrical connection allows the cover to be grounded.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A surface acoustic wave oscillator module, comprising:
    a single substrate having a top surface, a bottom surface and an outer peripheral edge;
    a plurality of castellations located about the outer peripheral edge, the castellations forming an electrical connection between the top surface and the bottom surface;
    at least one metallized slot located about the outer peripheral edge;
    at least one connection pad mounted on the top surface of said single substrate and connected to at least one of the castellations;
    an oscillator circuit mounted on the top surface of said single substrate and connected to at least one of the connection pads;
    a surface acoustic wave device hermetically sealed in a package, the package being mounted to the top surface of said single substrate and connected to at least one of the connection pads and coupled to the oscillator circuit; and
    a cover having at least one tab, the cover mounted to the top surface of the substrate, the tab being adapted to be fitted within the metallized slot, the tab and the metallized slot forming an electrical connection between the cover and the metallized slot.

2. The oscillator module according to claim 1, wherein the substrate has an inductor formed by a circuit line.

3. The oscillator module according to claim 2, wherein the substrate has at least one inner layer located between the top and bottom surfaces, the circuit line being formed on the inner layer.

4. The oscillator module according to claim 2, wherein the circuit line is located under the surface acoustic wave device.

5. The oscillator module according to claim 1, wherein the substrate is a printed circuit board.

6. The oscillator module according to claim 1, wherein the module has dimensions of approximately 5 mm in width, 7 mm in length and 2.7 mm in height.

7. A voltage controlled surface acoustic wave oscillator module, comprising:
    a single printed circuit board having a top surface, a bottom surface and an outer peripheral edge;
    a plurality of conductive castellations located about the outer peripheral edge, the castellations forming an electrical connection between the top surface and the bottom surface;
    at least one metallized slot located about the outer peripheral edge;
    a plurality of connection pads mounted on the top surface, at least one of the connection pads being connected to at least one of the castellations;
    an oscillator circuit mounted to the top surface of the single printed circuit board to a first portion of the connection pads;

a pre-packaged hermetically sealed surface acoustic wave device mounted to the top surface of the single printed circuit board to a second portion of the connector pads;

a cover having at least one tab, the cover being mounted to the top surface of the printed circuit board and enclosing the oscillator circuit and the surface acoustic wave device; and the tab being engaged with the metallized slot.

8. The oscillator module according to claim 7, wherein the printed circuit board has at least one inner layer located between the top and bottom surfaces.

9. The oscillator module according to claim 8, wherein a circuit line is located on the inner layer, the circuit line defining, an inductor.

10. The oscillator module according to claim 7, wherein the cover has at least one shoulder adapted to rest on the top surface and defines a gap between the printed circuit board and the cover.

11. The oscillator module according to claim 9, wherein the circuit line is located under the surface acoustic wave device.

12. The oscillator module according to claim 7, wherein the cover is spaced from the top surface by a gap.

13. The oscillator module according to claim 7, wherein the oscillator has dimensions of approximately 5 mm in width, 7 mm in length and 2.7 mm in height.

14. A surface acoustic wave oscillator module comprising:
a single printed circuit board substrate having a plurality of electrical components mounted to the top surface thereof including a surface acoustic wave resonator in a hermetically sealed package; and a cover seated over the single printed circuit board substrate and the plurality of components so as to define an oscillator module having overall dimensions of approximately 5 mm in width, 7 mm in length and 2.7 mm in height.

15. The oscillator module of claim 14, wherein the cover includes side walls defining lower peripheral edges with shoulders formed thereon such that a gap is defined between the printed circuit substrate and the cover when the cover is seated over the printed circuit board substrate.

* * * * *